United States Patent [19]

Murakami et al.

[11] Patent Number: 5,243,240
[45] Date of Patent: Sep. 7, 1993

[54] PULSE SIGNAL GENERATOR HAVING DELAY STAGES AND FEEDBACK PATH TO CONTROL DELAY TIME

[75] Inventors: Daisuke Murakami; Tadao Kuwabara, both of Kanagawa, Japan

[73] Assignee: Sony Corporation, Tokyo, Japan

[21] Appl. No.: 959,682

[22] Filed: Oct. 13, 1992

Related U.S. Application Data

[62] Division of Ser. No. 803,992, Dec. 9, 1991.

[30] Foreign Application Priority Data

Dec. 10, 1990 [JP] Japan .................................. 2-409770
Jan. 23, 1991 [JP] Japan .................................. 3-23952
Jan. 23, 1991 [JP] Japan .................................. 3-23953

[51] Int. Cl.⁵ ........................ H03K 5/13; H03K 5/159
[52] U.S. Cl. ................................... 307/603; 307/602; 307/608; 328/55
[58] Field of Search ............... 307/602, 603, 608, 606; 328/55, 155

[56] References Cited

U.S. PATENT DOCUMENTS

| | | | |
|---|---|---|---|
| 3,712,994 | 1/1973 | Graziani | 307/603 |
| 4,618,788 | 10/1986 | Backes et al. | 328/55 |
| 4,782,246 | 11/1988 | Kuroyanagi et al. | 328/155 |
| 5,146,121 | 9/1992 | Searles et al. | 307/608 |
| 5,159,205 | 10/1992 | Gorecki et al. | 307/602 |

Primary Examiner—William L. Sikes
Assistant Examiner—Toan Tran
Attorney, Agent, or Firm—Hill, Steadman & Simpson

[57] ABSTRACT

A pulse signal generator comprising a plurality of stages of delay gates connected in series for receiving an input pulse signal and generating an output pulse signal, each stage consists of a differential connection circuit and an emitter follower circuit, and has a signal delay time which is changed by varying the voltage that controls the current flowing in the current sink of the emitter follower circuit. The pulse signal generator further comprises a delay time signal generator receiving the input and the output pulse signals to generate a comparison pulse signal of a pulse duration corresponding to the delay time between the input pulse signal and the output pulse signal; a reference pulse signal generator for forming a reference pulse signal; and a correction voltage generator for forming a DC voltage corresponding to the difference between the pulse duration of the comparison pulse signal and the reference pulse signal; wherein the DC voltage of the correction voltage generator is connected to the current sink of at least one of the emitter follower circuits to vary the delay time per stage of the delay gates.

8 Claims, 11 Drawing Sheets

FIG. I

FIG. 13(A)
FIG. 13(B)
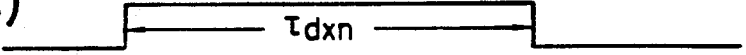
FIG. 13(C)
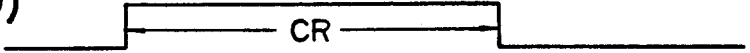
FIG. 13(D)
FIG. 13(E)
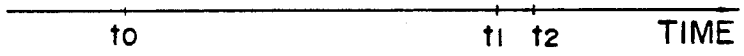
FIG. 14
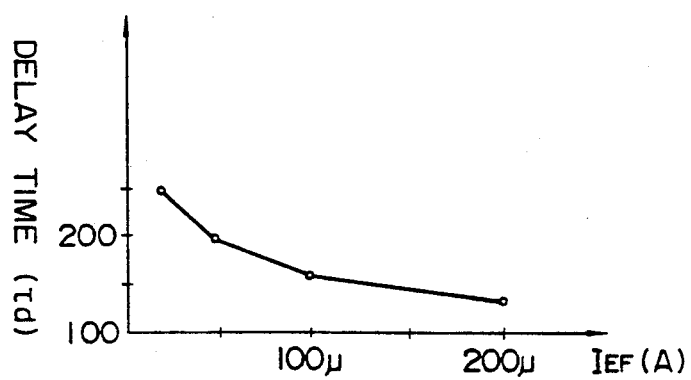

PULSE SIGNAL GENERATOR HAVING DELAY STAGES AND FEEDBACK PATH TO CONTROL DELAY TIME

This is a division of application Ser. No. 803,992, filed Dec. 9, 1991.

BACKGROUND OF THE INVENTION

1. Field of the Invention

The present invention relates to a pulse signal generator adapted particularly for use in controlling a pulse generation interval with high precision.

2. Description of the Prior Art

It has been known heretofore to employ, for varying a pulse duration, a pulse signal generator where a plurality of stages of delay gates are connected in series to one another so as to transmit an input signal with a time delay. An exemplary pulse signal generator comprises, as shown in a block diagram of FIG. 1, a plurality of stages of delay gates $Ga_1$–$Ga_n$, a plurality of multiplexers $M_1$–$M_{n-1}$, and a latch circuit 1. In such circuit configuration including $2_n$ delay gates Ga, there are required $2n-1$ multiplexers. In this example, the delay circuit is composed of 8 delay gates $Ga_1$–$Ga_8$, 7 multiplexers $M_1$–$M_7$ and a latch circuit 1 for latching a digital signal of 3 bits ($D_0$–$D_2$), and an input pulse signal and a delayed pulse signal obtained from such delay circuit are supplied respectively to a set input terminal S and a reset input terminal R of an R-S flip flop 2 so as to generate a pulse signal having a predetermined pulse duration.

In the delay circuit of the constitution shown in FIG. 1, control signals $S_0$–$S_6$ outputted from the latch circuit 1 serve to control the operations of the multiplexers $M_1$–$M_7$ respectively, whereby each of the signals received from input terminals, IN, INB is delayed by a predetermined time. Consequently, fixed delay amounts are accumulated and increased due to passage of the signals through the n multiplexers between the individual delay gates and the output terminal $Q_1$, thereby prolonging the formable minimum pulse duration. In addition, there exists another disadvantage that the delay errors caused by the multiplexers $M_1$–$M_7$ are integrated in accordance with a numerical increase of the multiplexers through which the signals pass, hence impairing the monotony of the delay characteristic.

In an attempt to solve the above problems for enhancing both the precision and monotony of the pulse duration with another purpose of reducing the formable minimum pulse duration, differential amplifiers $DA_1$, $DA_2$, $DA_3$ ... each composed of a pair of transistors Tr are connected respectively to the delay gates Gb1, Gb2, Gb3 as shown in FIG. 2. And the outputs of the paired transistors Tr of the differential amplifiers are supplied to a cascode amplifier 10, thereby switching on or off a pair of differential amplifier transistors 10a, 10b which constitute the cascode amplifier 10. In this constitution, resistors R1, R2 are connected respectively to the output terminals of such transistors 10a, 10b.

Accordingly, when switching circuits SW1, SW2, SW3 ... are selectively actuated in accordance with a given delay condition to operate one of the aforementioned differential amplifiers $DA_1$, $DA_2$, $DA_3$ ..., then signals OUT and OUTB delayed by a predetermined time with extremely high precision from the input signals can be obtained from the output terminals of the pair of differential amplifier transistors 10a, 10b.

However, when the input signal is delayed in the manner mentioned, there arises a problem that some jitters are caused in an operation performed at a super-high speed. Suppose now an exemplary case where the output of the delay gate $Gb_n$ in the circuit configuration of FIG. 2 is selected when the switching circuit $SW_n$ is at a high level ("H").

In this state, if the terminal IN is turned from a low level ("L") to a high level ("H") in response to a pulse fed to the input terminal, then the base voltage of the transistor $Ti_{11}$ constituting the differential amplifier $DA_1$ is turned from "L" to "H" after the lapse of the propagation delay time of the delay gate $Gb_1$. Subsequently the base voltages of the transistors $Tr_{21}$, $Tr_{31}$ ... $Tr_{n1}$ constituting the differential amplifiers $DA_2$, $DA_3$ ... are turned sequentially from "L" to "H". In this case, the base voltages of the other transistors $Tr_{12}$, $Tr_{22}$ ... $Tr_{n2}$ are turned from "H" to "L".

At the time of state transition of each transistor Tr, the current for charging the capacity of the base-emitter junction of the transistor Tr comes to flow in the amplifier 10 cascode-connected to the transistor Tr, so that such current appears as noise in the output signals OUT and OUTB.

For example, when the output is transmitted to the cascode amplifier 10 after the switching circuit $SW_n$ is selected upon passage of the input pulse through the n stages of delay circuits, if another pulse is fed to the input terminal, then the latter pulse comes to flow in the resistors $R_1$, $R_2$ via the parasitic capacitance of each transistor Tr. Consequently, noise is induced at points C and CB and is thereby superposed on the output waveform of the cascode amplifier 10. As a result, the amplitude of the signal obtained from the output terminals OUT and OUTB becomes different from a predetermined value to eventually bring about a disadvantage of causing jitters.

The reason for occurrence of such jitters will now be described below with reference to FIGS. 3 through 5. FIGS. 3 and 4 show voltage waveforms obtained at points A, AB, C and CB when signals are fed to the input terminals IN and INB, in which FIG. 4 is an enlarged view of a portion proximate to 800 ps. In these waveform charts, I represents a first voltage scale indicative of the potentials at the points A and AB, and II represents a second voltage scale indicative of the potentials at the points C and CB.

As obvious from FIGS. 3 and 4, when an input signal is fed, noise N of 12 mV or so is generated in the vicinity of 800 ps. Due to generation of such noise, as shown in the waveform chart of FIG. 5, the amplitude of the signal becomes different from the normal value to consequently cause a time delay Δt at the inversion of the signal polarity, hence inducing jitters.

There is known another exemplary pulse signal generator contrived for the purpose of changing a pulse duration, wherein a plurality of stages of delay gates are connected in series to one another to delay an input signal by a predetermined time. In such conventional pulse signal generator, as shown in a block diagram of FIG. 2, one delay circuit comprises a plurality of stages of delay gates $Gb_1$–$Gb_{n+1}$, differential connection circuits $DA_1$–$DA_{n+1}$ for transmitting the signal through the delay gates $Gb_1$–$Gb_{n+1}$ at a predetermined timing to an output circuit 10, and switching circuits $SW_1$–$SW_{n+1}$ for selectively operating the delay gate $Gb_1$–$Gb_{n+1}$.

A required number, e.g. 128, of such delay circuits are connected in series to one another, and the switching circuits $SW_1$, $SW_2$, $SW_3$ ... $SW_{n+1}$ are selectively actuated in accordance with a given delay condition to operate one of the differential amplifiers $DA_1$, $DA_2$, $DA_3$ ... $DA_{n+1}$, whereby the input signal supplied via an input buffer circuit is delayed by a predetermined time with extremely high precision, and the delayed signal is transmitted from output terminals OUT and OUTB of the output circuit 10.

The required number of the delay circuits are connected in series to one another via delay-circuit connecting wires. In such series arrangement of the delay circuits, it is possible to connect the entire delay circuits in a row if the joints of connection are numerically small. However, in the aforementioned exemplary case where a multiplicity (e.g. 128) of the delay circuits are arranged in a pattern layout on a semiconductor chip, a linear or straight arrangement is not achievable. Therefore, when forming series connection of multiple delay circuits, it is customary to employ such a pattern layout as illustrated in FIG. 6 where the delay circuits are arranged in a plurality, e.g. four, by 32 stages.

In such arrangement divided into a plurality of stages, no problem is existent as far as the series connection itself is concerned, but the delay-circuit connecting wire 22 in each turned portion is rendered longer than that in any other portion. Consequently the wiring capacity in the turned portion becomes far greater than that in any other straight portion to eventually bring about a disadvantage that the delay time linearity is deteriorated in the turned portion 23.

OBJECTS AND SUMMARY OF THE INVENTION

It is a first object of the present invention to provide an improved pulse signal generator which is capable of reducing a formable minimum pulse duration while suppressing occurrence of jitters even in a superhigh-speed operation.

A second object of the invention resides in preventing variations of a delay time that may otherwise be caused by variations in the values of resistors formed in an integrated circuit, thereby maintaining the delay time constant per gate.

A third object of the invention is to provide an improvement where the current-to-voltage conversion speed is not lowered despite any great stray capacity which may exist in a current-to-voltage converter included in a cascode circuit.

And a fourth object of the invention resides in enhancing the linearity of the pulse delay time in a pulse signal generator where delay circuits are arranged in a plurality of stages.

According to one aspect of the present invention, there is provided a pulse signal generator comprising a plurality of stages of delay gates connected in series to one another for delaying input signals fed to input terminals; first differential connection circuits interposed respectively between the stages of the delay gates so as to transmit, at a predetermined timing, the signal passed through the delay gates; first and second input lines for supplying the output signals of the first differential connection circuits to a cascode amplifier; and second differential connection circuits each consisting of a pair of transistors which are supplied with the same input signals as those fed to each pair of transistors constituting the first differential connection circuit, wherein the second differential connection circuit is connected to the first and second input lines in such a manner that the outputs of the transistors thereof become inverse in polarity to the outputs of the transistors of the corresponding first differential connection circuit.

According to another aspect of the present invention, there is provided a pulse signal generator where a plurality of stages of delay gates consisting of differential connection circuits and emitter follower circuits are connected in series to one another, and the delay time per stage of the delay gates is changed by varying the value of the current flowing in the differential connection circuits and that in current sinks of the emitter follower circuits. The pulse signal generator comprises a delay time signal generating circuit for forming a comparison pulse signal of a pulse duration corresponding to the delay time of the input pulse signal caused by passing the same through a predetermined number of the delay gates; a reference pulse signal generating circuit for forming, on the basis of the time constant of a capacitor and a resistor, a reference pulse signal of a pulse duration corresponding to the delay time of the input pulse signal derived from the passage thereof through a predetermined number of the delay gates; and a correction voltage generating circuit for forming a DC voltage corresponding to the difference between the pulse duration of the comparison signal and that of the reference pulse signal; wherein the voltage for controlling the value of the current flowing in the current sink of the differential connection circuit is supplied separately from the voltage for controlling the value of the current flowing in the current sink of the emitter follower circuit, and the DC correction voltage outputted from the correction voltage generating circuit is supplied to the current sink of the emitter follower circuit to change the operating current, thereby controlling the delay time per stage of the delay gates.

According to a further aspect of the present invention, there is provided a pulse signal generator equipped with a plurality of delay circuits each comprising a delay gate for delaying a signal fed to an input terminal, and a differential connection circuit for transmitting, at a predetermined timing, the signal passed through the delay gate. The delay gates are connected in series to one another, and the wiring capacity in a portion with the maximum wiring length between the delay circuits is determined as a reference wiring capacity, wherein an additional capacity is given between any delay circuits in which the capacity is smaller than the reference wiring capacity, thereby mutually equalizing the capacities between the entire delay circuits.

The above and other features and advantages of the present invention will become apparent from the following description which will be given with reference to the illustrative accompanying drawings.

BRIEF DESCRIPTION OF THE DRAWINGS

FIGS. 13A-13E are timing waveforms for explaining the operation of the pulse signal generator of the present invention shown in FIG. 12;

FIG. 14 is a characteristic diagram graphically showing the relationship between the value of the current, which flows in an emitter follower circuit employed in the pulse signal generator of the present invention shown in FIG. 12, and the delay time per stage of delay gates.

DESCRIPTION OF THE PREFERRED EMBODIMENTS

Hereinafter a first embodiment of the pulse signal generator according to the present invention will be described in detail with reference to a circuit diagram of FIG. 7. This embodiment is concerned with a circuit for outputting a delayed signal.

Figure 7:
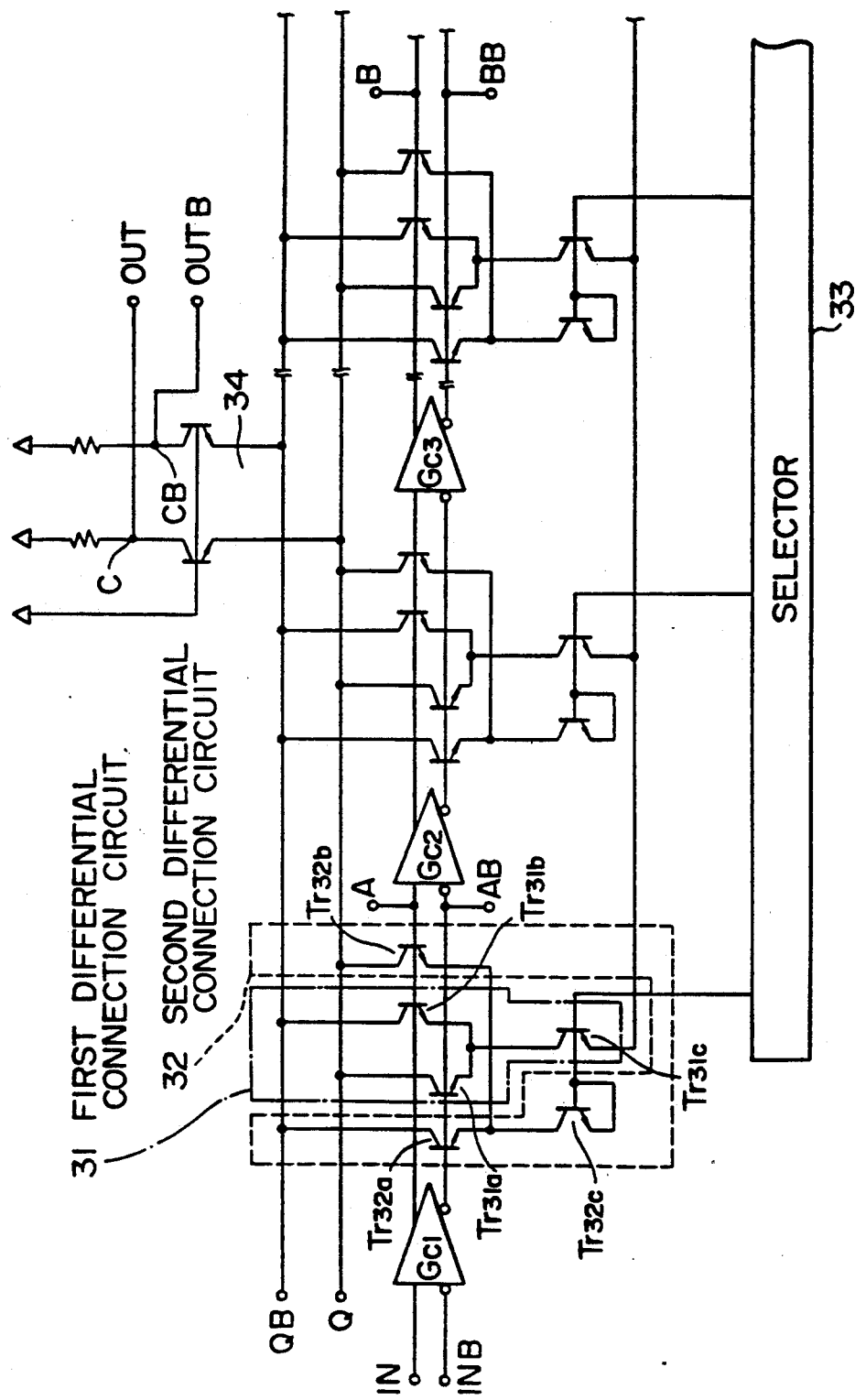
FIG. 7 is a circuit diagram of principal components in a first embodiment of the present invention.

As apparent from FIG. 7, the pulse signal generator of the present invention is equipped with a first differential connection circuit 31 and a second differential connection circuit 32 which are interposed between delay gates G.

The first differential connection circuit 31 comprises a pair of transistors 31a, 31b connected to be mutually differential, and a switching transistor 31c turned on at a predetermined timing selected by a selector 33. The circuit 31 serves to transmit input signals to output terminals OUT and OUTB.

Meanwhile the second differential connection circuit 32 serves to reduce the aforementioned noise, and comprises a pair of transistors 32a, 32b connected similarly to the first differential connection circuit 31, and a transistor 32c which corresponds to the switching transistor 31c and is connected to the pair of transistors 32a, 32b. The transistor 32c is kept in an off-state with its emitter and base connected directly to each other.

The first and second differential connection circuits 31, 32 of such configurations are connected to input lines Q and QB of a cascode amplifier 7 in such a manner that the outputs of the transistors Tr31a, Tr31b and those of the transistors Tr32a, Tr32b obtained from the respective collectors become mutually inverse in polarity.

With regard to the first transistors Tr31a and Tr32a whose bases are connected to each other, the transistor Tr31a is connected to the input line Q, while the transistor Tr32a is connected to the input line QB. As for the other transistors Tr31b and Tr32b corresponding to each other, the transistor Tr31b is connected to the input line QB, while the transistor Tr32b is connected to the input line Q.

Figure 5:
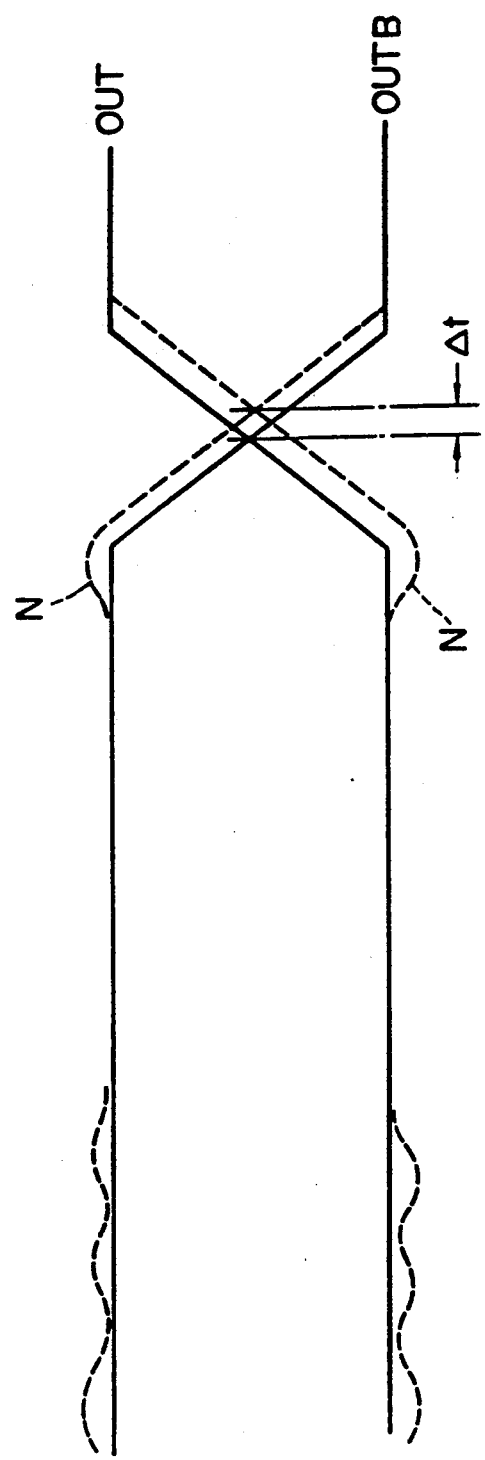
FIG. 5 is a waveform chart for explaining a time delay caused by noise.
Figure 6:
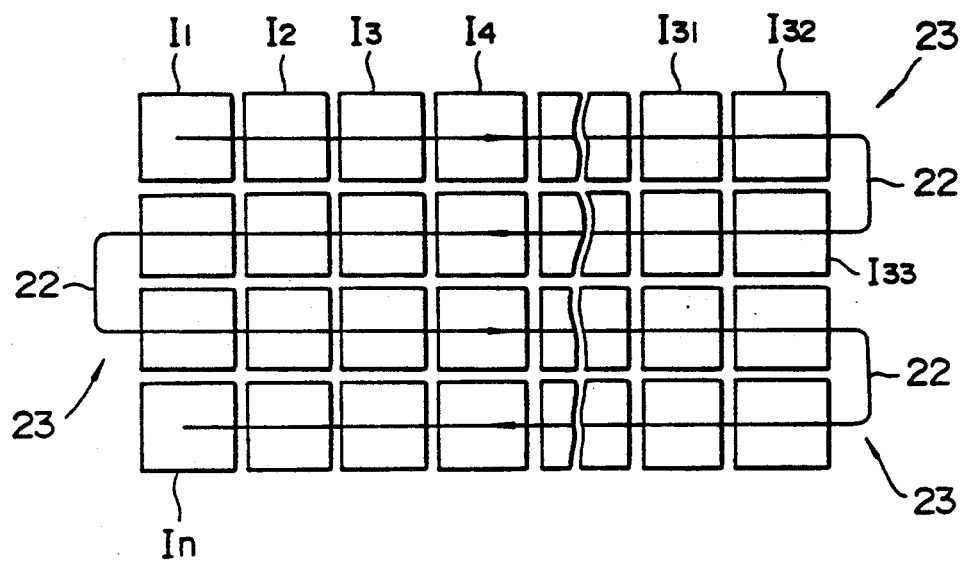
FIG. 6 illustrates a pattern of arrangement of conventional delay circuits shown in FIG. 3.
Figure 8:
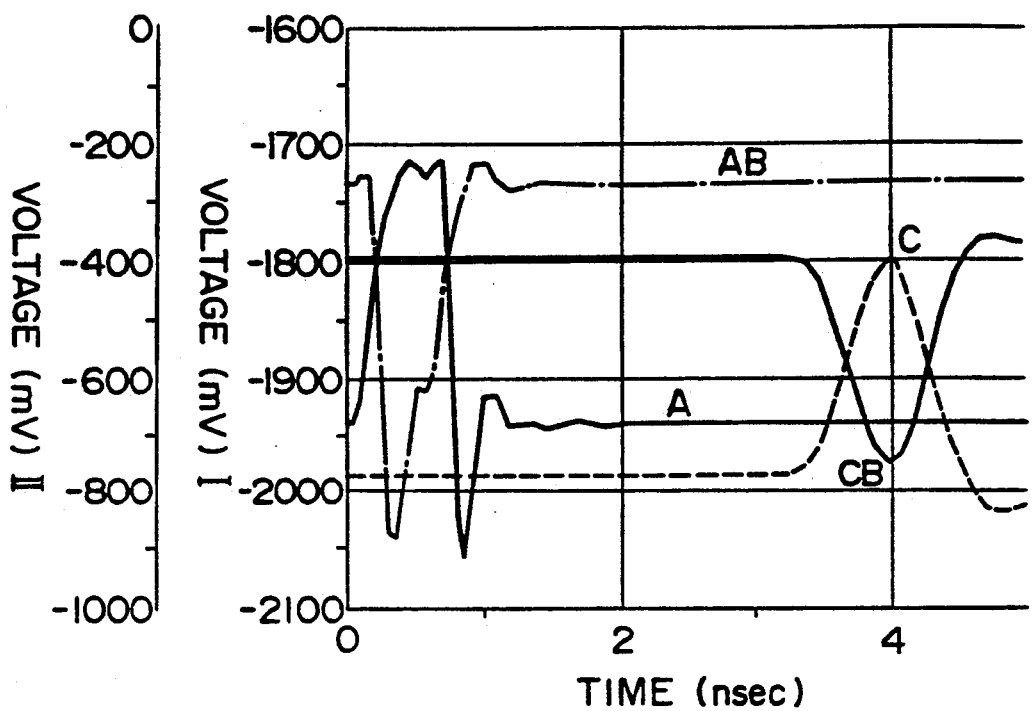
FIG. 8 is a waveform timing chart of voltages produced when a pulse input is supplied to the circuit of the first embodiment shown in FIG. 7.
Figure 9:
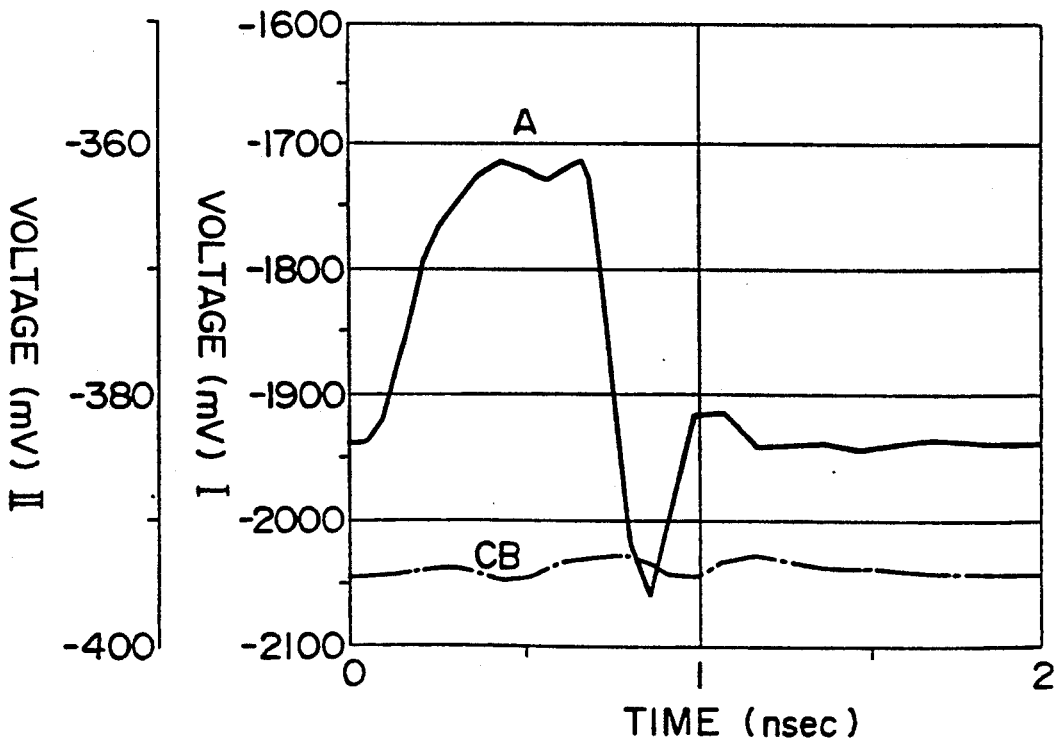
FIG. 9 is a waveform timing chart for explaining characteristic portions in the chart of FIG. 8 relative to the present invention.

In the pulse signal generator of this embodiment, the mutually corresponding transistors out of those in the first and second differential connection circuits 31, 32 are connected to the input lines Q and QB of the cascode amplifier 34 in such a manner that the respective outputs become inverse in polarity to each other as mentioned, so that when pulse signals are fed to the input terminals IN and INB, the transistors with base voltages turned from a low level ("L") to a high level ("H") and the same number of the transistors with base voltages turned from "H" to "L" are both connected to one input line. It follows therefore that, at the time of state transition of the transistors, the charge/discharge currents relative to the junction capacities of the transistors cancel each other. Accordingly, as graphically shown in a characteristic diagram of FIG. 8 and an enlarged characteristic diagram of FIG. 9, none of noise N appears at the output terminal CB. Consequently it becomes possible to completely prevent a disadvantage of occurrence of the delay time Δt described already with reference to FIG. 5, hence suppressing generation of jitters despite input of any random pulse to the super-high-speed delay line.

In the present invention, as mentioned above, delay gates for delaying an input signal are connected in series to one another in an arrangement to form a plurality of stages. A first differential connection circuit is interposed between the adjacent delay gates so a to transmit the signal, and a second differential connection circuit having the same constitution as that of the first differential connection circuit is also interposed between the adjacent delay gates in such a manner that, at the time of state transition of the transistors, charge/discharge currents relative to the junction capacities of the transistors cancel each other. Thus, the entire time required for forming an output pulse signal from the beginning to the end can be controlled with remarkably high precision with another advantage of widely enhancing the accuracy of the pulse duration. In addition, it becomes further possible to prevent, on the main signal, superposition of the noise which is derived from the charge/discharge current relative to the capacity in the base-collector junction of each transistor constituting the first differential connection circuit. Consequently no jitter is induced despite input of any random pulse signal.

Figure 10:
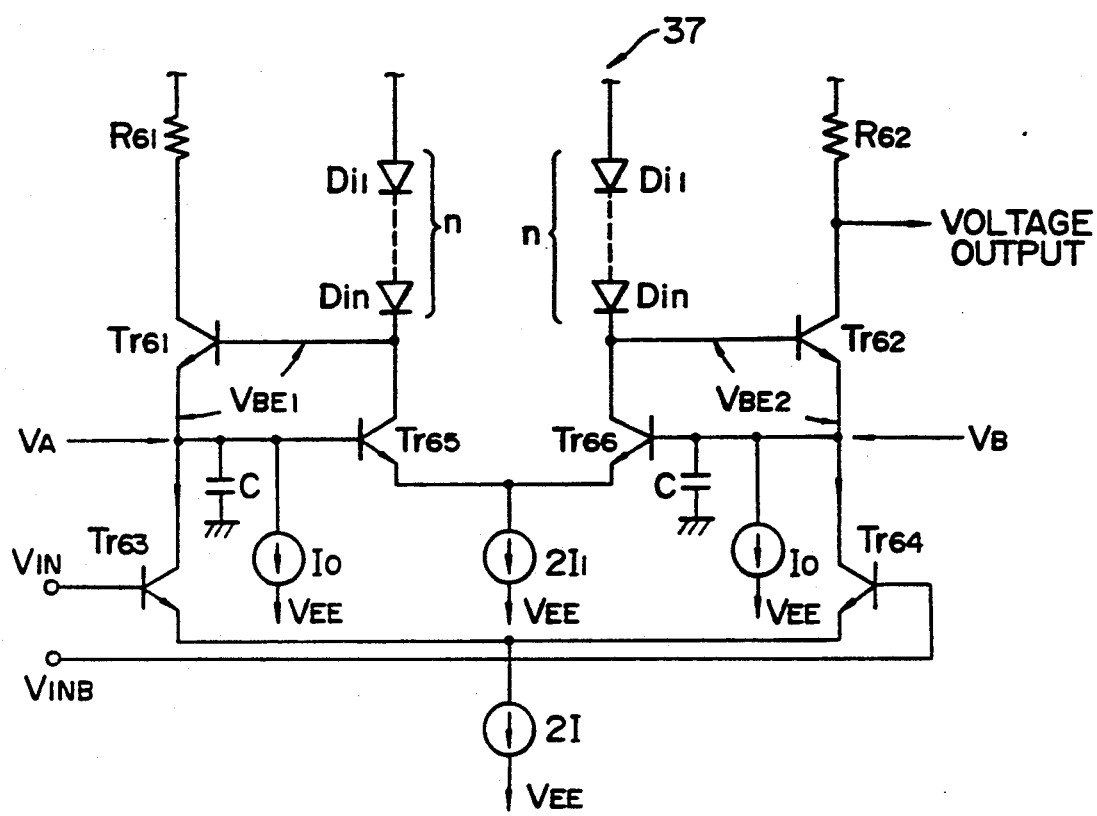
FIG. 10 is a specific circuit diagram of a cascode circuit representing a second embodiment of the present invention.

FIG. 10 is a circuit block diagram of a second embodiment representing the cascode circuit of the present invention. This cascode circuit is effective in widely improving the characteristic when applied to, for example, the cascode amplifier 34 included in the first embodiment of the present invention shown in FIG. 7.

In the cascode circuit 37 according to the second embodiment, as apparent from FIG. 10, the base of a transistor Tr65 is connected to the junction of the emitter of a transistor Tr61 and the collector of a transistor Tr63.

Meanwhile the base of a transistor Tr66 is connected to the function of the emitter of a transistor Tr62 and the collector of a transistor Tr64. Furthermore, n diodes Di₁–Di$_n$ are connected as a load to the collector of the transistor Tr65 (Tr66), and the base of the transistor Tr61 (Tr62) is connected to the junction of the collector of the transistor Tr65 (Tr66) and the diodes Di₁–Di$_n$. The emitters of the transistors Tr65, Tr66 connected to each other are further connected via a constant current source to a power source V$_{EE}$.

When the transistor Tr63 is turned on in the cascode circuit 37 of this embodiment having the constitution mentioned, it follows that the collector current of the transistor Tr63 is increased. Therefore the potential difference between the emitter and the base of the transistor Tr61 needs to be sufficiently great. Accordingly, in case the base voltage of the transistor Tr61 is fixed, the emitter voltage needs to be lowered. In contrast therewith, the cascode circuit 37 of this embodiment is so formed that the emitters of both transistors Tr65 and Tr66 are connected to each other and, when the emitter voltage of the transistor Tr61 is about to be lowered, the base voltage of the transistor Tr65 is lowered instead, whereby its collector voltage is increased. More specifically, the base-emitter voltage of the transistor Tr65 is lowered at the above timing to consequently reduce the current flowing in the transistor Tr65. Therefore the current flowing in the n diodes Di₁–Di$_n$ connected to the collector of the transistor Tr65 is also reduced to lower the forward voltage V$_f$, whereby the base voltage of the transistor Tr61 is increased in proportion thereto. As a result, the base-emitter potential difference of the transistor Tr61 is increased fast to immediately cause a flow of an operating current therein.

Since the emitter of the transistor Tr61 is given a sufficiently great capacity as mentioned, it has been customary heretofore that a long time is required for lowering the emitter voltage. Meanwhile the base has no capacity and therefore the base voltage is increased immediately in accordance with fall of the emitter voltage of the transistor Tr61. Accordingly, in the cascode circuit 37 of this embodiment, the transistor Tr61 can be turned on extremely faster than in the conventional circuit where the base voltage is fixed, hence realizing quicker transmission of the signal despite the existence of any great stray capacity.

Now the above operation will be described more specifically by the use of numerical expressions. The transistors Tr63, Tr64 are switched on and off by the input voltages V$_{IN}$ and V$_{INB}$. When the voltage V$_{IN}$ applied to the transistor Tr63 is at a high level ("H"), the base-emitter voltage V$_{BE1}$ of the transistor Tr61 is varied by a value of $kT/q \cdot I_n (I_0+2I)/I_0$ under the following conditions.

$$V_A = V - \Delta V \quad (1)$$

$$V_B = V + \Delta V \quad (2)$$

Consequently, $$[\{V+\Delta V-(V-\Delta V)\}]2re \times nre + \Delta V]$$

$$= kT/q \cdot \mu_n (I_0+2I)/I_0 \quad (3)$$

Therefore, $$\Delta V = 1/(n+1) \cdot kT/q \cdot \mu_n (I_0+2I)/I_0 \quad (4)$$

Since the transistors Tr63 and Tr64 are switched on and off, the emitter voltages thereof are each varied by a value of $1/(n+1) \cdot kT/q \cdot \mu_n (I_0+2I)/I_0$.

Accordingly, in the cascode circuit 37 of this embodiment, a desired result is attained by charging and discharging the following amount Q despite the existence of any parasitic capacity such as wiring capacity in the collectors of the transistors Tr63 and Tr64.

$$Q = C \cdot kT/q \cdot \mu_n (I_0+2I)/I_0 \quad (5)$$

Thus, it becomes possible to achieve a wide enhancement in the operating speed.

Similarly to the description given above with regard to the transistor Tr63, the same operation can be performed relative to the transistor Tr64 as well. If the transistor Tr64 is switched off, a current I₀ alone comes to flow in the collector of the transistor Tr62. Therefore the emitter voltage of the transistor Tr62 is urged to rise. When the emitter voltage of the transistor Tr62 is about to be increased, the base voltage of the transistor Tr66 is raised to increase the base-emitter voltage of the transistor Tr66, whereby the current flowing in the transistor Tr66 is also increased to consequently raise the voltage applied to the diodes Di₁—Di$_n$. As a result, the base voltage of the transistor Tr62 is lowered to bring about a fast reduction of the base-emitter voltage V$_{BE2}$ of the transistor Tr62. Therefore the transistor Tr62 is switched off quickly, and thus the delay derived from the stray capacity can be widely diminished on the side relative to the transistors Tr62 and Tr64.

Figure 11:
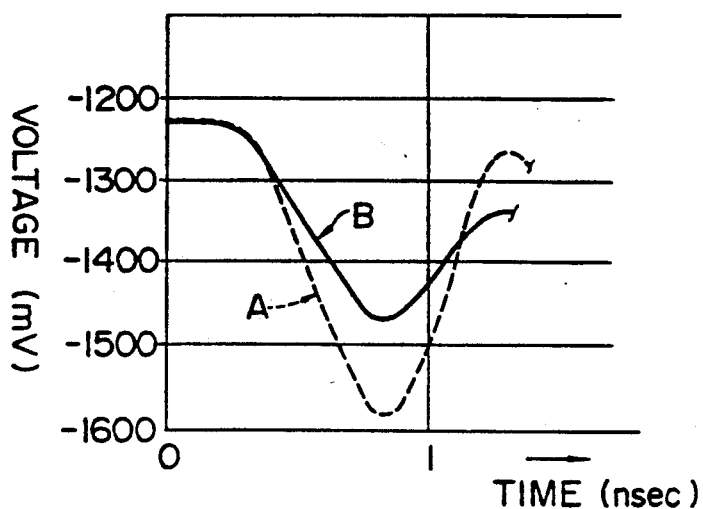
FIG. 11 graphically shows the operating characteristic of the cascode circuit representing the second embodiment of the present invention in FIG. 10.

FIG. 11 is a characteristic diagram graphically showing a comparison between the operation of the cascode circuit 37 shown in FIG. 10 and the operation of a conventional cascode circuit. In this diagram, a broken-line curve A represents the characteristic obtained when one diode D is connected in the cascode circuit 37 of this embodiment, and a solidline curve B represents the characteristic of the conventional cascode circuit.

As apparent from FIG. 11, the voltage change gradient in the cascode circuit 37 of this embodiment can be rendered sharper than that in the conventional circuit to consequently ensure with certainty a reduction of the signal delay caused by the stray capacity.

Figure 2:
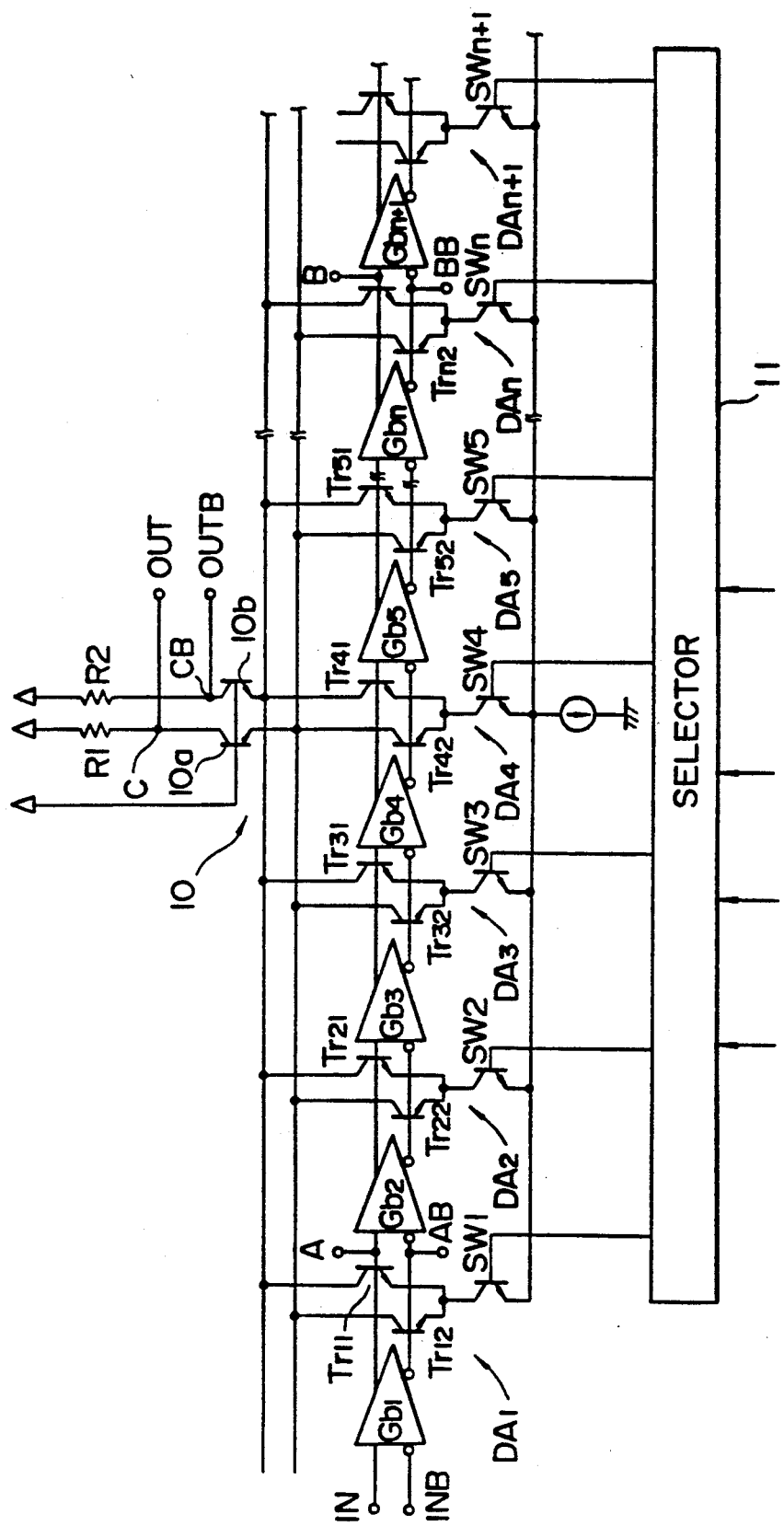
FIG. 2 is a circuit block diagram of a second conventional example contrived to solve the problems in the known pulse signal generator shown in FIG. 1.
Figure 3:
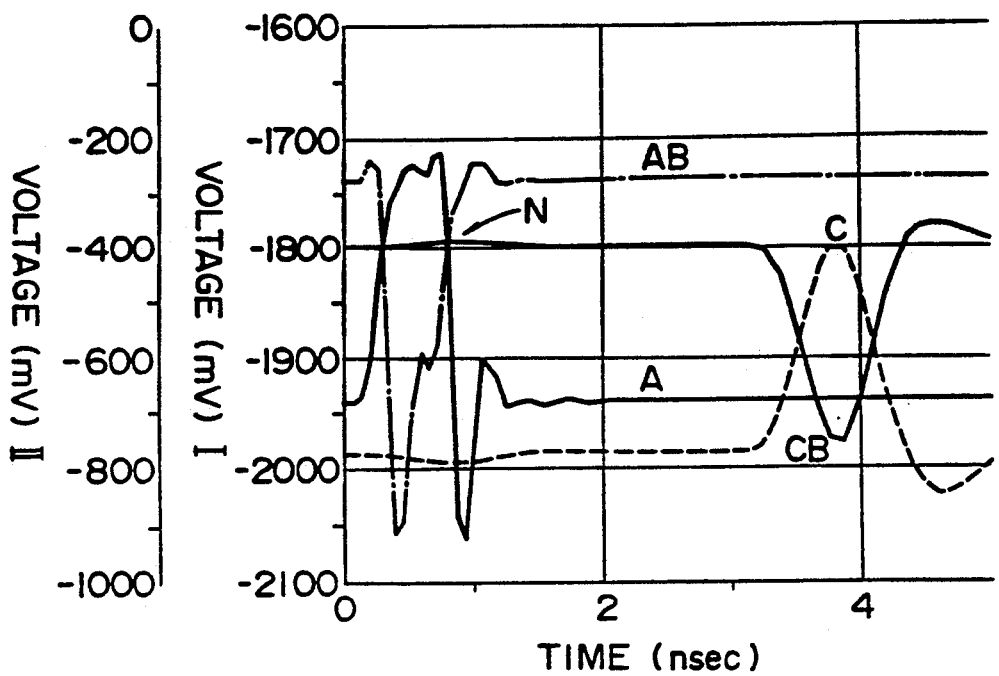
FIG. 3 is a waveform timing chart of voltages produced in the pulse signal generator of the second conventional example shown in FIG. 2.
Figure 4:
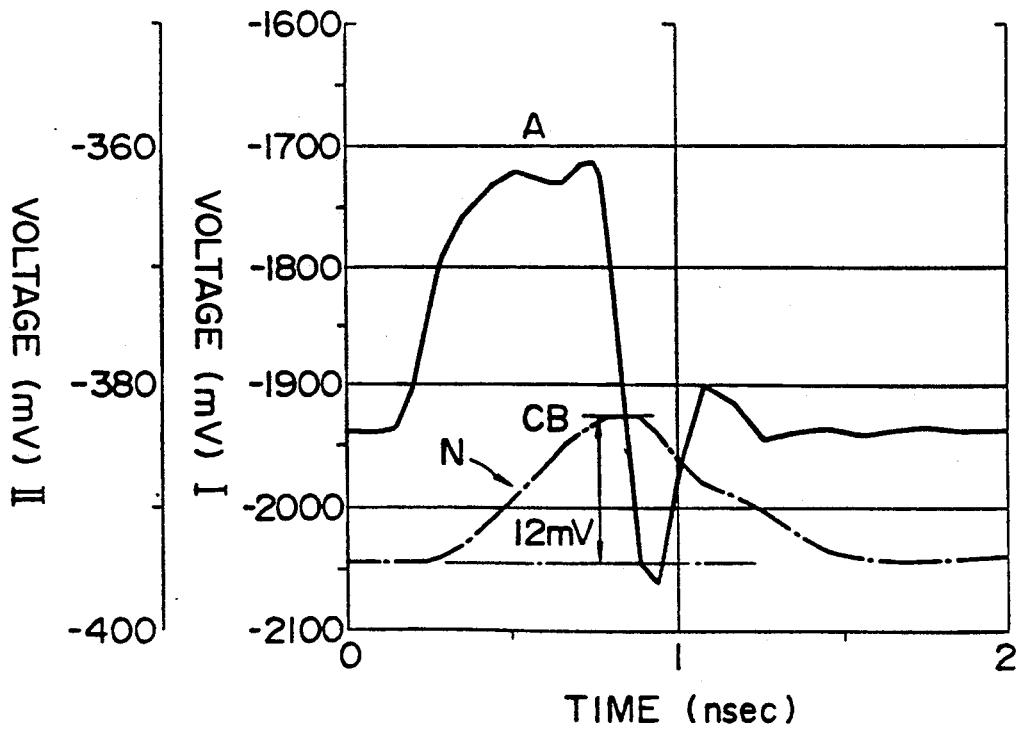
FIG. 4 is a waveform timing chart for explaining characteristic portions in the waveform timing chart of FIG. 3.

The cascode circuit 37 of this embodiment having the constitution mentioned is adapted for use in a pulse signal generator shown in a circuit block diagram of FIG. 2.

In the pulse signal generator of FIG. 2 equipped with a delay circuit, the entire outputs of delay gates G are supplied to a cascode circuit 10 where current-to-voltage conversion is executed and the voltage signal is outputted therefrom. In this case, therefore, a great stray capacity is existent in each emitter of the transistors 10a and 10b in the cascode circuit 10. Accordingly, unless such harmful influence of the stray capacity is compensated, there occurs a signal delay in the cascode circuit 10 to eventually fail in exact transmission of the pulse signal. However, in this embodiment where a high speed operation is possible despite the existence of any great stray capacity, the delay time can be controlled with remarkably high precision to consequently ensure high accuracy and fine change in the pulse duration of the output pulse signal S$_{out}$.

According to the present invention, as described above, voltage-to-current conversion is executed by a pair of transistors in differential connection, to which a pair of signal output transistors are further connected respectively, and a voltage signal is produced from the current signal generated by the voltage-to-current conversion transistors via such signal output transistors. Furthermore the emitter voltage variation in the pair of voltage signal output transistors is detected, and the base voltage thereof is changed in accordance with the detected emitter voltage variation, thereby increasing the gradient of the baseemitter potential change in the voltage signal output transistors in accordance with the input signal. Consequently, despite the existence of any great stray capacity in the emitter of the voltage signal output transistor, it is possible to perform a proper operation of switching on and off the voltage signal output transistors prior to charge or discharge of the stray capacity, hence sharply suppressing the harmful influence of the stray capacity on the execution of the current-to-voltage conversion.

Hereinafter a third embodiment of the present invention will be described. This embodiment represents an example contrived for enhancing the electric characteristics of a pulse signal generator equipped with a delay circuit.

In the pulse signal generator, a plurality of stages of delay gates consisting of differential connection circuits and emitter follower circuits are connected in series to one another, and the signal delay time per stage of the delay gates is changed by varying the value of the current flowing in the differential connection circuits. The pulse signal generator further comprises a delay time signal generating circuit for forming a comparison pulse signal of a pulse duration corresponding to the delay time of the input pulse signal caused by passing the same through a predetermined number of the delay gates; a reference pulse signal generating circuit for forming, on the basis of the time constant of a capacitor and a resistor, a reference pulse signal of a duration corresponding to the delay time of the input pulse signal derived from the passage thereof through a predetermined number of the delay gates; and a correction voltage generating circuit for forming a DC voltage corresponding to the difference between the pulse duration of the comparison pulse signal and that of the reference pulse signal. In such constitution, the voltage for controlling the value of the current flowing in the current sink of the differential connection circuit is supplied separately from the voltage for controlling the value of the current flowing in the current sink of the emitter follower circuit, and the DC correction voltage outputted from the correction voltage generating circuit is supplied to the current sink of the emitter follower circuit to change the operating current, thereby controlling the delay time per stage of the delay gates.

Thus, a comparison pulse signal of a pulse duration corresponding to the delay time of the input pulse signal is formed by passing the same through a predetermined number of the delay gates, and such comparison pulse signal is compared with a reference pulse signal formed on the basis of the time constant of a capacitor and a resistor. Then the delay time of the input pulse signal is corrected in accordance with the result of such comparison, whereby the delay time per stage of the delay gates can be corrected with a high precision equivalent to the precision of the time constant of the capacitor and the resistor.

Now the third embodiment of the present invention will be described below with reference to the accompanying drawings.

Figure 12:
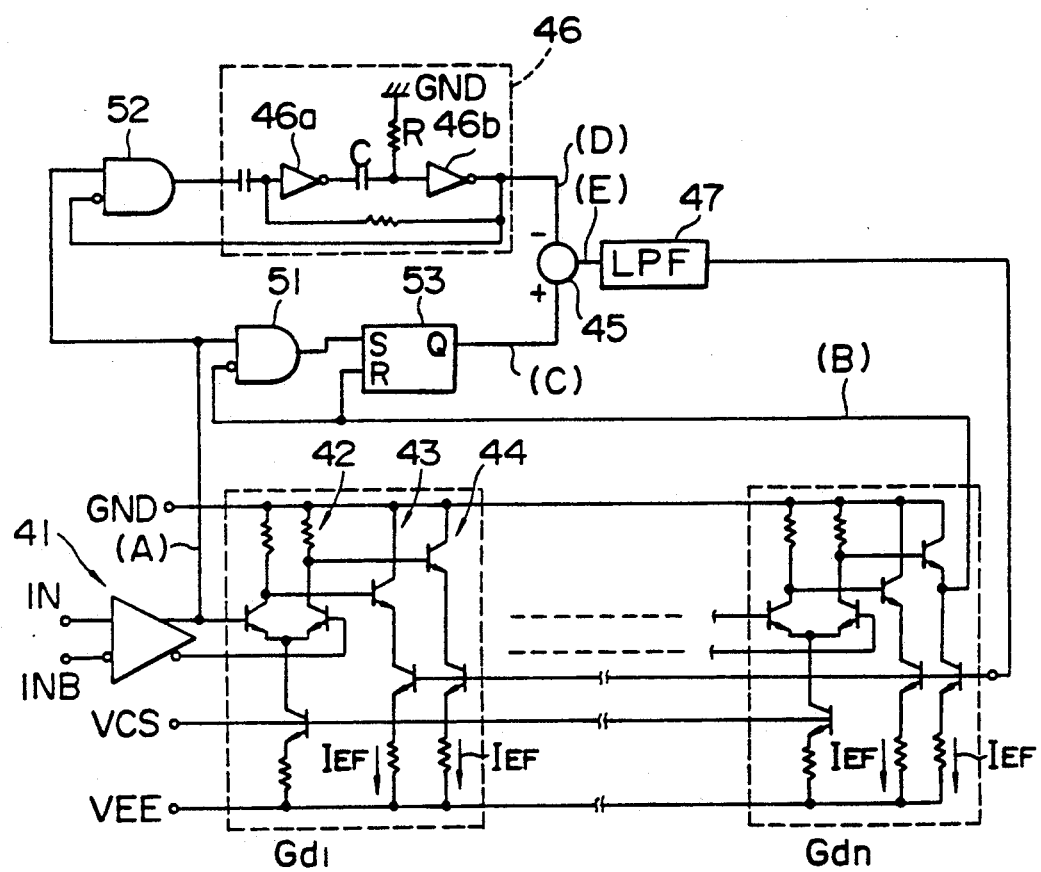
FIG. 12 is a circuit diagram of principal components in a pulse signal generator which is a third embodiment of the present invention.

FIG. 12 is a circuit diagram of the third embodiment representing the pulse signal generator of the invention. For facilitating the explanation on the principal components of the invention, the diagram shows merely the circuit portion concerned with the function of correcting the operation of delay gates $Gd_I$–$Gd_n$.

As apparent from FIG. 12, an input pulse signal (A) is supplied from an input buffer circuit 41 to a first delay gate $Gd_I$ while being supplied also to positive logical input terminals of both a first AND circuit 51 and a second AND circuit 52.

The first delay gate $Gd_I$ consists of a differential connection circuit 42 and emitter follower circuits 43, 44, wherein an input pulse signal (A) is supplied to the base of the transistor in the differential connection circuit 42 while an inverted signal of the input pulse signal (A) is supplied to the base of the other transistor.

Figure 1:
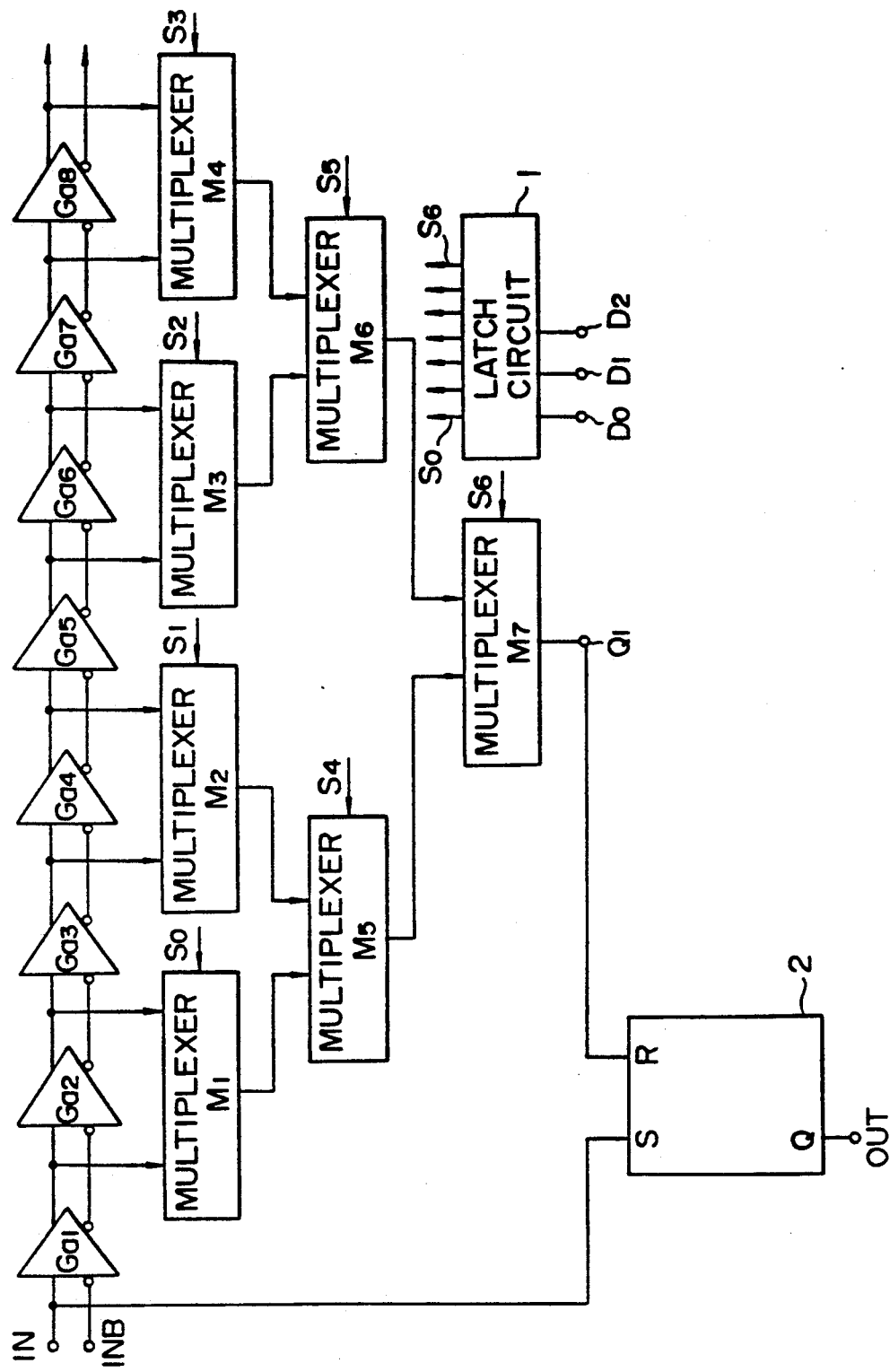
FIG. 1 is a circuit block diagram of a first conventional example representing a known pulse signal generator.

The output of one transistor is supplied to a next-stage delay gate G via the emitter follower circuit 43, while the output of the other transistor is supplied thereto via the emitter follower 44. Although omitted in FIG. 1 as mentioned, the output of the delay gate G in each stage is transmitted selectively to an output circuit.

The input signal (A) supplied to the first delay gate $Gd_I$ is fed sequentially to the delay gates G in the posterior stages, so that the output timing is delayed by a time corresponding to the number of the delay gates G through which the input pulse signal (A) has passed.

Due to passage of the input pulse signal (A) through the delay gate $Gd_n$ in the n-th stage, there is obtained a pulse signal (B) delayed from the input pulse signal (A) by a time $\tau d \times n$ (where $\tau d$ is the delay time per stage of the gates). The delayed pulse signal (B) thus obtained is then supplied from the delay gate $Gd_n$ in the n-th stage to the negative logical input terminal of the first AND circuit 51 while being supplied also to a reset terminal R of an R-S flip flop 53.

The output of the first AND circuit 51 is supplied to a set terminal S of the R-S flip flop 53, where a comparison pulse signal (C) is formed and transmitted from an output terminal Q thereof to an adder 5. The signal (C) has a pulse duration corresponding to the time required until the delayed pulse signal (B) is supplied to the reset terminal R after supply of the input pulse signal (A) to the set terminal S.

Meanwhile the output of the second AND circuit 52 is supplied to a leading-edge triggered monostable multivibrator 46 which comprises two inverters 46a, 46b connected in series to each other via a capacitor C, wherein the function of the capacitor C and the second inverter 46b is grounded via a resistor R. The output of the second AND circuit 52 is supplied via another capacitor to the first inverter 46a, and the output of the second inverter 46b is transmitted as a reference pulse signal (D) to the adder 45. Furthermore the reference pulse signal (D) is fed back to the input terminal of the first inverter 46a via a resistor while being fed back also to the negative logical input terminal of the second AND circuit 52.

In the constitution mentioned, the reference pulse signal (D) outputted from the leading-edge triggered monostable multivibrator 46 rises at an instant $t_0$ of supply of the input pulse signal (A) as shown in a waveform timing chart of FIG. 13 and retains a high level for a fixed period of $t_0$–$t_1$ determined by the time constant of the capacitor C and the resistor R. The time constant circuit consisting of such capacitor C and resistor R is provided outside of an integrated circuit, so that there exists no disadvantage of causing uneven variations in the circuit constant by the process to consequently ensure a remarkably high precision in the pulse duration CR of the reference pulse signal (D).

In the adder 45, the comparison pulse signal (C) supplied from the R-S flip flop 53 and the reference pulse signal (D) from the monostable multivibrator 46 are added to each other with the polarities thereof mutually inverted.

The comparison pulse signal (C) is kept at a high level during a period of $t_0$-$t_2$, while the reference pulse signal (D) is kept at a high level during a period of $t_0$-$t_1$. Therefore, a correction pulse signal (E) having a pulse duration equivalent to the difference between the two pulse signals (C) and (D) as shown in FIG. 13 is outputted from the adder 45 and then is supplied to a low pass filter 47. When the duration of the comparison pulse signal (C) is longer than that of the reference pulse signal (D), a positive correction pulse signal (E) is outputted as shown in FIG. 13. In case the duration of the reference pulse signal (D) is longer contrary to the above, a negative correction pulse signal (E) is outputted.

The low pass filter 47 produces a DC voltage whose polarity and level correspond to the pulse duration of the correction pulse signal (E) inputted thereto. Consequently, in this case, a positive DC voltage is produced as a correction DC voltage and is applied to the bases of the transistors in the current sinks of the emitter follower circuits 43, 44 in the delay gates $Gd_1$-$Gd_n$.

In this embodiment, the voltage applied to the base of the transistor in the current sink of the differential connection circuit 42 in each of the delay gates $Gd_1$-$Gd_n$ is supplied separately from the voltage applied to the bases of the transistors in the current sinks of the emitter follower circuits 43, 44, and a current sink control voltage VCS is applied to the base of the transistor in the current sink of the differential connection circuit 42 in a known manner.

The current $I_{EF}$ flowing in each of the emitter follower circuits 43, 44 is increased by the positive DC correction voltage supplied from the low pass filter 47.

FIG. 14 is a characteristic diagram graphically showing the relationship between the value of the emitter follower current $I_{EF}$ and the delay time per stage of the delay gates G. As apparent from FIG. 14, the delay time $\tau d$ becomes shorter in accordance with an increase of the emitter follower current $I_{EF}$ or becomes longer to the contrary in accordance with a decrease of the emitter follower current $I_{EF}$.

Therefore, when the emitter follower current $I_{EF}$ is increased by the positive DC voltage supplied from the low pass filter 47, the delay time in each of the delay gates $Gd_1$-$Gd_n$ is changed to be shorter, whereby the duration of the comparison pulse signal (C) is reduced to be approximate to the duration of the reference pulse signal (D). As a result, the duration of the correction pulse signal (E) is also reduced gradually and, upon mutual coincidence of the respective durations of the comparison pulse signal (C) and the reference pulse signal (D), the correction pulse signal (E) is no further outputted. It signifies completion of correcting the delay time variation derived from the resistance value variation, whereby the delay time per stage of the delay gates $Gd_1$-$Gd_n$ is controlled to the predetermined value.

Contrary to the exemplary case mentioned above, if the duration of the comparison pulse signal (C) is shorter than that of the reference pulse signal (D) due to the internal resistance variation toward a smaller value in the integrated circuit, a negative DC correction pulse signal (E) is outputted from the adder 45 and then is supplied to the bases of the transistors in the current sinks of the emitter follower circuits 43, 44, whereby the emitter follower current $I_{EF}$ is reduced to consequently change the delay time in each of the delay gates $Gd_1$-$Gd_n$ in the direction to increase the same. And finally the correction is completed upon mutual coincidence of the respective durations of the comparison pulse signal (C) and the reference pulse signal (D).

In the pulse signal generator of this embodiment where the delay time in each of the delay gates $Gd_1$-$Gd_n$ is controlled in the manner mentioned, any great variation in the internal resistance of the integrated circuit caused in the process of manufacturing the integrated circuit can be properly corrected to eventually achieve high-precision control of the delay time per stage of the delay gates.

Further in the pulse signal generator of this embodiment, the voltage for controlling the current in the current sink of the differential connection circuit is supplied separately from the voltage for controlling the current in each current sink of the emitter follower circuits 43, 44, so that the amplitude of the pulse signal waveform is never varied despite control of the delay time by adjusting the value of the emitter follower current $I_{EF}$, hence realizing satisfactory control of the delay time without any inconvenience.

Due to the correction thus executed in this embodiment, it becomes possible to maintain the delay time constant per delay gate G not merely when there exists some delay time variation derived from the internal resistance variation but also in another case where the delay time variation is induced by the variation in the temperature characteristic or the power supply voltage.

According to the present invention, as described hereinabove, a comparison pulse signal, which has a pulse duration equivalent to the time required for an input pulse signal to pass through a predetermined number of delay gates, is formed and compared with a reference pulse signal formed in conformity with the time constant of a capacitor and a resistor, thereby producing a correction voltage based on the result of such comparison. And the current flowing in each of the emitter follower circuits is changed by such correction voltage to correct the delay time of the input pulse signal. Consequently it is possible to attain high-precision correction of the delay time per stage of the delay gates correspondingly to the precision of the time constant of the capacitor and the resistor, hence maintaining the delay time constant per gate while eliminating any harmful influence that may otherwise be exerted on the delay time from the variations in the circuit constants of the delay gates or those in the temperature characteristic, the power supply voltage and so forth.

Hereinafter a fourth embodiment of the present invention will be described.

In this embodiment representing a pulse signal generator of the invention, one delay circuit comprises a delay gate for delaying a signal fed to an input terminal, and a differential connection circuit for transmitting, at a predetermined timing, the input signal passed through the delay gate. A plurality of such delay circuits are connected in series to one another, and the wiring capacity in a portion with the maximum wiring length between the delay circuits is determined as a reference wiring capacity, wherein an additional capacity is given between any adjacent delay circuits in which the capacity is smaller than the reference wiring capacity, so as to mutually equalize the capacities between the entire delay circuits.

Another feature of this embodiment resides in connecting a dummy wire between any adjacent delay circuits where the wiring capacity is smaller than the reference wiring capacity, thereby equalizing the capacities between the entire adjacent delay circuits.

Thus, the wiring capacities between the entire delay circuits are rendered uniform in accordance with the reference capacity which is equivalent to the wiring capacity in the portion with the maximum wiring length, whereby the capacities between the entire delay circuits are equalized. Consequently the delay time of the input pulse signal is rendered accurately proportional to the number of the delay circuits through which the input pulse signal passes.

Now the fourth embodiment of the invention will be described below in detail with reference to the accompanying drawings.

Figure 15:
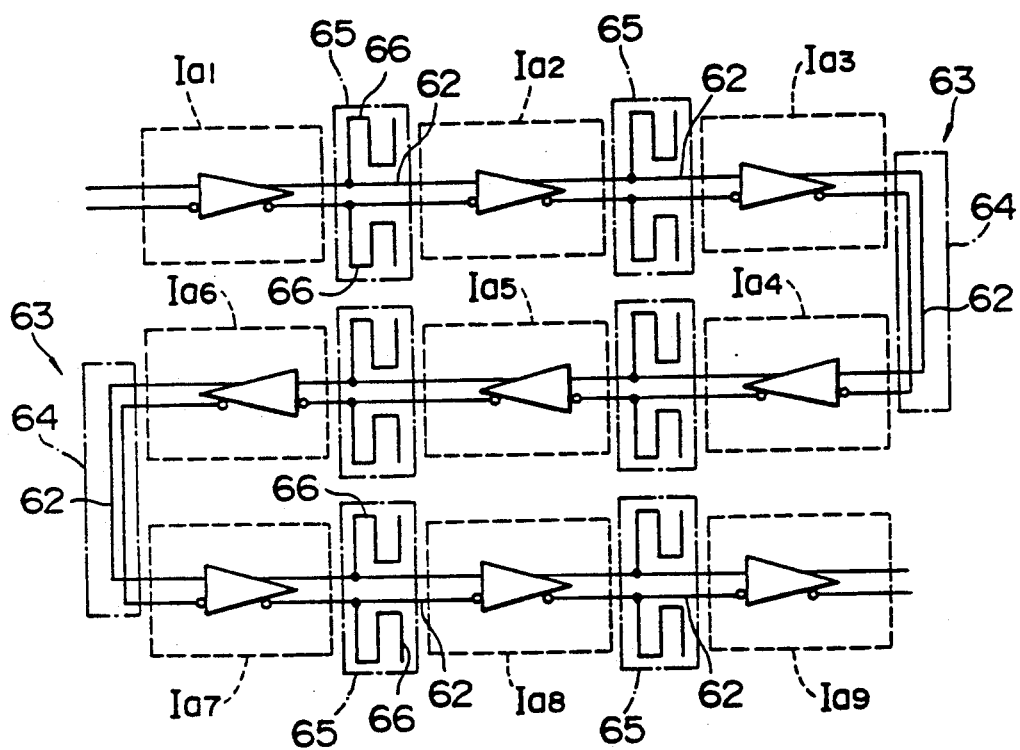
FIG. 15 illustrates a pattern of delay circuits representing a fourth embodiment of the present invention.

FIG. 15 illustrates an arrangement pattern of delay circuits 1 in the fourth embodiment representing the pulse signal generator of the invention. In this embodiment is shown an exemplary pattern layout where nine delay circuit $Ia_1$–$Ia_9$ are divided into three stages.

As apparent from FIG. 15, the length of each wire connecting the adjacent delay circuits Ia in a straight arrangement is different from the length in a turned portion 63 where the delay circuit arrangement is turned.

More specifically, the length of each delay-circuit connecting wire 62 is extremely short in any portion of a straight arrangement, e.g., between delay circuits $Ia_1$ and $Ia_2$ or between delay circuits $Ia_2$ and $Ia_3$. And practically it is possible to array the delay circuits in such a manner that the output terminal of the preceding-stage delay circuit and the input terminal of the following-stage delay circuit are disposed in the extreme proximity.

Meanwhile in the turned portion 63, the length of the delay-circuit connecting wire 62 is several times longer than that in the straight portion. Therefore the wiring capacity derived from the delay-circuit connecting wires 62 in the straight portion of the delay circuit arrangement is widely different from that in the turned portion. For the purpose of eliminating such disadvantage, this embodiment includes an improved arrangement where a dummy wire 66 is additionally connected to each delay-circuit connecting wire 62 in the straight portion so that the wiring capacity 65 in the straight portion becomes equal to the wiring capacity 64 in the turned portion.

Thus, in the pulse signal generator of the fourth embodiment, the individual wiring capacities between entire adjacent delay circuits can be equalized to one another. Consequently the linearity of the delay time is not deteriorated in the turned portion 63 to eventually ensure generation of a proper pulse signal whose delay time is controlled with high precision.

In the integrated circuit where the delay-circuit connecting wires 62 are composed of aluminum, the wiring resistance is considerably great. However, the wiring resistance is substantially ignorable with regard to the delay time to which the wiring capacity is dominant, so that a satisfactory result is attainable by giving consideration merely to the wiring capacity. Accordingly, the individual paths for connecting the adjacent delay circuits need not exactly be the same in wiring capacity, and the requirement can be satisfied if the overall wiring capacities in both portions are the same. Therefore, as contrived in the fourth embodiment, the delay time linearity can be enhanced by additionally connecting dummy wires 66 to mutually equalize the wiring capacities between the entire adjacent delay circuits without widely increasing the area for arrangement of the delay circuits.

As described above, according to this embodiment where a plurality of delay circuits are connected in series to one another via connecting wires, the wiring capacity in a portion with the maximum length of the delay-circuit connecting wire is determined as a reference wiring capacity, and the wiring capacities between the individual adjacent delay circuits is adjusted to be equal to such reference capacity, whereby the wiring capacities between the entire adjacent delay circuits are equalized to one another. Thus the delay time of the input pulse signal can be rendered accurately proportional to the number of the delay circuits through which the input pulse signal passes, hence achieving remarkable enhancement of the delay time linearity in the arrangement where the delay circuits are disposed in a plurality of stages.

Furthermore, the wiring capacities between the entire adjacent delay circuits are equalized to one another by connecting a dummy wire to each delay-circuit connecting wire in any portion of the arrangement where the wiring capacity is smaller than the reference capacity, so that it becomes possible to render the wiring capacities uniform between the entire adjacent delay circuits without increasing the area for arrangement of the delay circuits.

What is claimed is:

1. A pulse signal generator comprising a plurality of stages of delay gates connected in series for receiving an input pulse signal and generating a delayed output pulse signal, each stage consisting of a differential connection circuit and an emitter follower circuit, and having a signal delay time which is changed by varying a voltage that controls a value of the current flowing in a current sink of said differential connection circuit and that in a current sink of said emitter follower circuit, said pulse signal generator further comprising:

a delay time signal generating circuit receiving said input and output pulse signals for forming a comparison pulse signal of a pulse duration corresponding to the delay time between said input and output pulse signals;

a reference pulse signal generating circuit for forming, on the basis of a time constant of a capacitor and a resistor, a reference else signal of a pulse duration corresponding to a delay time of the input pulse signal derived from the passage thereof through a predetermined number of said delay gates; and a correction voltage generating circuit for forming a DC voltage corresponding to the difference between the pulse duration of said comparison pulse signal and that of said reference pulse signal;

wherein the voltage for controlling the value of the current flowing in the current sink of each said differential connection circuit is supplied separately from the voltage for controlling the value of the current flowing in the current sink of each said emitter follower circuit, and the DC correction voltage outputted from said correction voltage generating circuit is supplied to the current sink of at least one of said emitter follower circuits to change the value of the current in the current sink, thereby controlling the delay time per stage of said delay gates.

2. The pulse signal generator according to claim 1, wherein each of said differential connection circuits has an individual current sink circuit, and means for connecting a voltage to a control input of each of said current sink circuits for said differential connection circuits.

3. The signal generator according to claim 1, wherein each of said emitter follower circuits comprise a pair of transistors having their inputs connected to outputs of one of said differential connection circuits, and each of said transistors being provided with an individual current sink, and means for connecting a voltage to the control inputs of each of said current sinks of said emitter follower circuits.

4. The pulse signal generator according to claim 1, said delay time signal generating circuit including a bistable element connected to receive said input signal which is supplied to the first of said stages, said bistable element producing said comparison signal at an output thereof, and said bistable element being reset by a signal connected from the last of said stages, whereby said bistable element produces a comparison signal having a pulse duration corresponding to the delayed time of the input pulse signal caused by passing the same through a predetermined number of said delay gates.

5. Apparatus according to claim 1, wherein said reference pulse signal generating circuit comprises a monostable multivibrator, having its input connected to a signal supplied as an input to the first of said plurality of stages, whereby said reference pulse signal is produced having a pulse duration corresponding to a time constant of said monostable multivibrator.

6. The pulse signal generator according to claim 1, wherein said correction voltage generating circuit comprises means for deriving a difference between said comparison signal and said reference pulse signal with a sign of said DC voltage corresponding to whether the length of said comparison signal exceeds that of said reference pulse signal, or vice versa.

7. The pulse signal generator according to claim 6, wherein said correction voltage generating circuit comprises subtraction means, said subtraction means having a noninverting input connected to receive said comparison signal, and an inverting input connected to receive said reference pulse signal.

8. The pulse signal generator according to claim 7, including a low pass filter connected to the output of said subtraction means, whereby said DC voltage is proportional to an average of a difference between a pulse duration of said comparison pulse signal and that of said reference pulse signal.

* * * * *